(12) United States Patent
Yamada et al.

(10) Patent No.: US 8,955,406 B2
(45) Date of Patent: Feb. 17, 2015

(54) WORKPIECE TRANSFER APPARATUS

(75) Inventors: Takaya Yamada, Osaka (JP); Masashi Kamitani, Osaka (JP)

(73) Assignee: Daihen Corporation (JP)

( * ) Notice: Subject to any disclaimer, the term of this patent is extended or adjusted under 35 U.S.C. 154(b) by 340 days.

(21) Appl. No.: 13/600,498

(22) Filed: Aug. 31, 2012

(65) Prior Publication Data

US 2013/0058740 A1   Mar. 7, 2013

(30) Foreign Application Priority Data

Sep. 6, 2011   (JP) ................................ 2011-194269

(51) Int. Cl.
*B65G 49/00*   (2006.01)
*H01L 21/677*   (2006.01)
*H01L 21/67*   (2006.01)

(52) U.S. Cl.
CPC .... *H01L 21/67742* (2013.01); *H01L 21/67109* (2013.01); *H01L 21/67766* (2013.01)
USPC .......................... 74/490.01; 414/217; 414/221

(58) Field of Classification Search
CPC ...................... F16H 15/0616; H01L 21/67742; H01L 21/67109; H01L 21/6766
USPC ............... 74/490.01, 490.02, 490.03, 490.04, 74/490.05, 490.06; 414/217, 220, 221
See application file for complete search history.

(56) References Cited

U.S. PATENT DOCUMENTS

| 5,902,088 | A  | * | 5/1999  | Fairbairn et al. ............... 414/217 |
| 7,510,624 | B2 | * | 3/2009  | Liang et al. ............... 156/345.33 |
| 8,033,771 | B1 | * | 10/2011 | Gage et al. .................... 414/217 |
| 8,454,294 | B2 | * | 6/2013  | Gage et al. .................... 414/217 |

FOREIGN PATENT DOCUMENTS

JP      2007-118171 A     5/2007

* cited by examiner

*Primary Examiner* — David M Fenstermacher
(74) *Attorney, Agent, or Firm* — Cantor Colburn LLP

(57) ABSTRACT

The vacuum seal unit of a workpiece transfer apparatus includes a plurality of seal rings and a cooling flow passage formed so as to circulate through inside a rotating shaft and a workpiece transfer mechanism. The seal rings adjacent to each other with a spacing therebetween, out of the plurality of seal rings, and the rotating shaft define a first space and a second space independent from each other and respectively surrounding the periphery of the rotating shaft. An end portion of the cooling flow passage communicates with the first space, and the other end of the cooling flow passage communicates with the second space. Even when the rotating shaft is rotating about the axial center, a coolant supplied to the second space can flow through the cooling flow passage and be supplied to the first space, thereby enabling cooling with high efficiency without restriction on the angle of rotation.

2 Claims, 10 Drawing Sheets

US 8,955,406 B2

WORKPIECE TRANSFER APPARATUS

BACKGROUND OF THE INVENTION

1. Technical Field

The present invention relates to a technique of a workpiece transfer apparatus that includes a workpiece transfer mechanism configured to transfer a workpiece inside a vacuum chamber, a base member that rotates the workpiece transfer mechanism from outside of the vacuum chamber, and a vacuum seal unit configured to seal a gap between the workpiece transfer mechanism and the base member.

2. Background Art

With reference to the workpiece transfer apparatus configured as above, a technique of cooling the workpiece transfer mechanism to thereby suppress the influence of radiant heat from the heated workpiece has conventionally been known. For example, such a technique is disclosed in Patent document 1.

According to Patent document 1, the vacuum seal unit (rotating base) configured to seal a gap between the workpiece transfer mechanism and the base member includes an air pump and a cooling circuit (cooling flow passage), routed from the pump into and then out of the workpiece transfer mechanism, using seal rings or the like. With such a configuration, air sent from the air pump flows through the cooling circuit, thereby cooling the workpiece transfer mechanism.

However, in the technique disclosed in Patent document 1, air is used as a coolant. Air has a specific heat capacity lower than that of water. Accordingly, as compared with the case where a liquid such as water is used as a coolant, there is a problem that cooling effect for the workpiece transfer mechanism may be insufficient.

In order to use a liquid such as water as a coolant, for example a configuration shown in FIG. 10A may be adopted. FIG. 10A depicts a vacuum seal unit 500 configured to seal a gap between a workpiece transfer mechanism 20 and a base member 10, in which a cooling pipe 510 (cooling flow passage) that allows a liquid to flow therethrough is routed from a pump (not shown) into and out of the workpiece transfer mechanism 20 inside a rotating shaft 520 that rotates the workpiece transfer mechanism 20. With such a configuration, the workpiece transfer mechanism 20 can be cooled by making the liquid fed from the pump flow through the pipe 510.

[Patent Document 1] Japanese Unexamined Patent Application Publication No. 2007-118171.

However, with the configuration shown in FIG. 10A, when the workpiece transfer mechanism 20 is made to rotate, that is, when the rotating shaft 520 rotates, the cooling pipe 510 is twisted as shown in FIG. 10B. The twist of the cooling pipe 510 leads to the drawback in that the angle of rotation of the rotating shaft 520 is restricted, and hence the angle of rotation of the workpiece transfer mechanism 20 is restricted.

The present invention has been achieved in view of the above problems. An object of the present invention is to provide a workpiece transfer apparatus that can cool a workpiece transfer mechanism by use of a liquid such as water as a coolant and can prevent the angle of rotation of the workpiece transfer mechanism from being restricted.

SUMMARY OF THE INVENTION

To achieve the aforementioned problems, the present invention proposes the following technical measures.

In an embodiment, the present invention provides a workpiece transfer apparatus that includes a workpiece transfer mechanism configured to transfer a workpiece inside a vacuum chamber, a base member that rotates the workpiece transfer mechanism from outside of the vacuum chamber, and a vacuum seal unit configured to seal a gap between the workpiece transfer mechanism and the base member. The vacuum seal unit includes a rotating shaft connecting the workpiece transfer mechanism and the base member, a support bearing portion configured to support the rotating shaft so as to rotate about the axial center thereof, a plurality of annular seal members each disposed between the rotating shaft and the support bearing portion, and a cooling flow passage through which a coolant flows, the cooling flow passage being formed so as to circulate through inside the rotating shaft and inside the workpiece transfer mechanism. The annular members adjacent to each other with a spacing therebetween, out of the plurality of annular members, and the rotating shaft define a first space and a second space independent from each other and respectively surrounding the outer circumferential surface of the rotating shaft. An end portion of the cooling flow passage communicates with a portion of the outer circumferential surface of the rotating shaft corresponding to the first space, and the other end portion of the cooling flow passage communicates with a portion of the outer circumferential surface of the rotating shaft corresponding to the second space, so as to allow the coolant introduced into the second space to flow through the cooling flow passage and to reach the first space, even when the rotating shaft is rotated about the axial center.

In another embodiment of the workpiece transfer apparatus, the annular seal members adjacent to each other with a spacing therebetween, out of the plurality of annular seal members, and the rotating shaft define a third space independent from both the first space and the second space and surrounding the outer circumferential surface of the rotating shaft. The vacuum seal unit includes a second cooling flow passage communicating between inside and outside of the third space. The third space allows the coolant that has leaked through the annular seal member that defines the first space and the second space to be introduced into the third space, and to flow through the second cooling flow passage thus to be discharged to outside, even when the rotating shaft is rotating about the axial center.

The present invention provides the following advantageous effects.

With the first mentioned workpiece transfer apparatus, even when the workpiece transfer mechanism is made to rotate, in other words even when the rotating shaft is rotating about the axial center, the cooling flow passage is kept from being twisted and therefore the angle of rotation of the workpiece transfer mechanism is exempted from being restricted. In addition, a liquid such as water can be used as the coolant to be circulated through the cooling flow passage.

With the second mentioned workpiece transfer apparatus, even when the coolant introduced into the second space leaks, the coolant that has leaked is introduced into the third space, flows through the second cooling flow passage, and is discharged to outside. Therefore, the influence of the leakage of the coolant on the workpiece transfer apparatus (for example, occurrence of vacuum leakage) can be suppressed.

DETAILED DESCRIPTION

Hereafter, the embodiments of the present invention will be described.

First, the overall configuration of a workpiece transfer apparatus 1 according to a first embodiment of the present invention will be described with reference to the accompanying drawings.

In the following description, each of a front-back direction, a right-left direction, and a top-bottom direction will be defined in accordance with respective arrow directions shown in each of the drawings.

Figure 1:
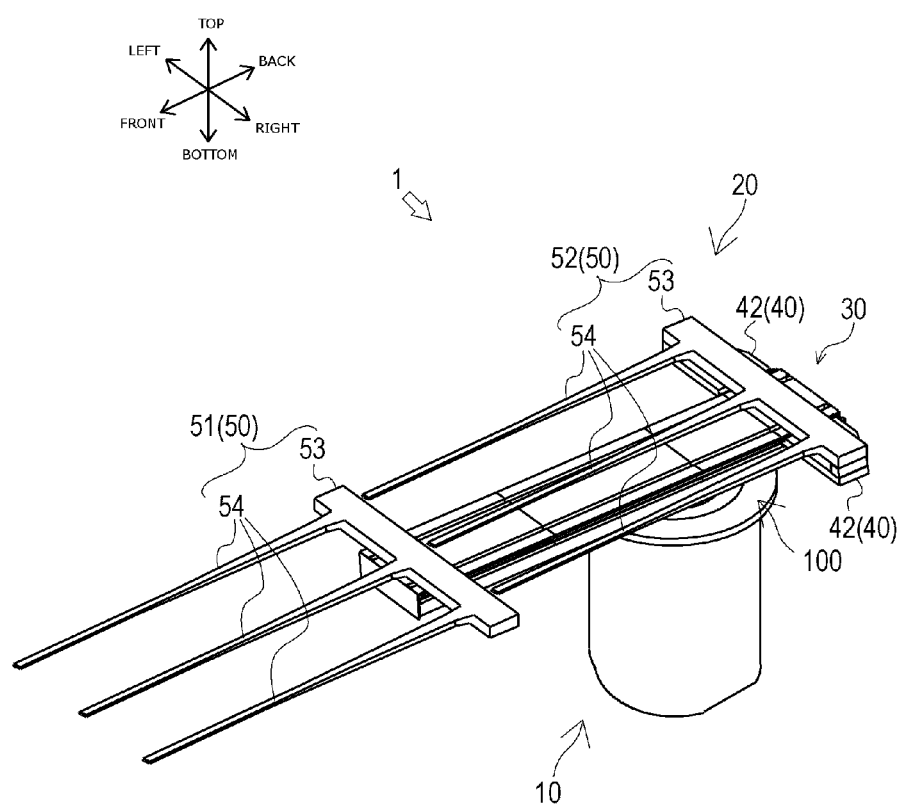
FIG. 1 is a perspective view showing the overall configuration of a workpiece transfer apparatus according to a first embodiment of the present invention.
Figure 2:
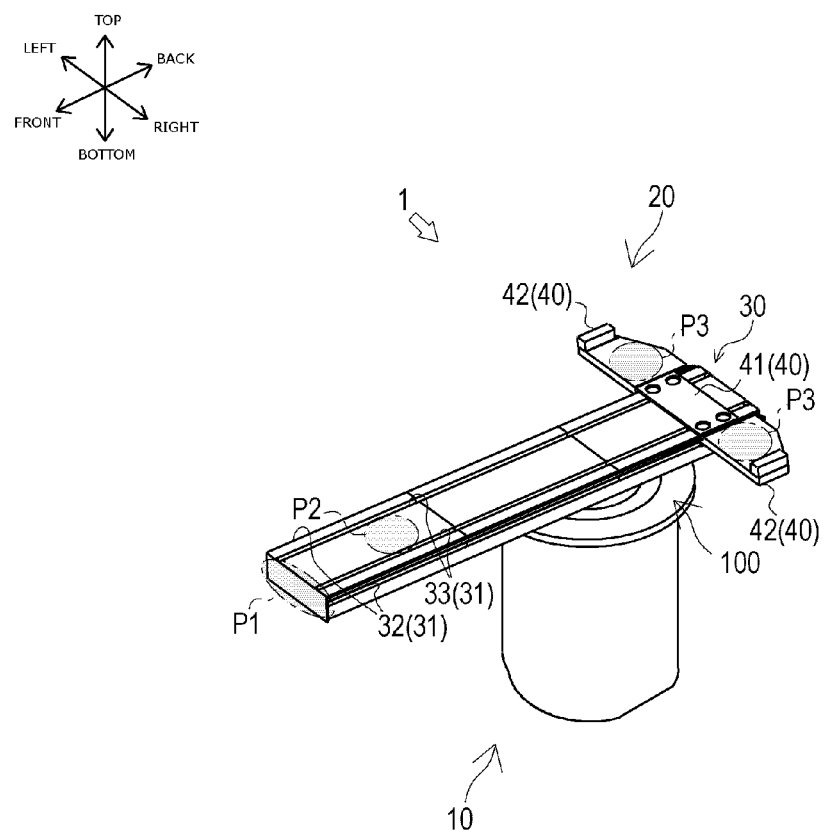
FIG. 2 is a perspective view showing the workpiece transfer apparatus according to the first embodiment, from which a first hand and a second hand are omitted.

The workpiece transfer apparatus 1 shown in FIGS. 1 and 2 includes a workpiece transfer mechanism 20 configured to transfer a workpiece inside a vacuum chamber in which a vacuum state is maintained. In this embodiment, although description will be made on the assumption that the workpiece is a thin plate-shaped component such as a liquid crystal panel, the workpiece is not limited to this example.

The workpiece transfer apparatus 1 includes mainly the workpiece transfer mechanism 20, a base member 10, and a vacuum seal unit 100.

The workpiece transfer mechanism 20 shown in FIGS. 1 and 2 is configured to transfer the workpiece in the horizontal direction inside the vacuum chamber. The workpiece transfer mechanism 20 mainly includes a main body 30, sliders 40, and hands 50.

The main body 30 constitutes a main structure of the workpiece transfer mechanism 20. The main body 30 is of a generally rectangular plate shape having the longitudinal sides oriented in the front-back direction, and the plate surfaces oriented in the top-bottom direction.

On the upper surface of the main body 30, two pairs of guide rails 31 are disposed such that the respective longitudinal directions are aligned with the front-back direction. Hereafter, the guide rails 31 located on the outer side in the respective pairs in a plan view will be referred to as "outer side guide rails 32", and the guide rails 31 located on the inner side of the outer side guide rails 32 will be referred to as "inner side guide rails 33". A main body driving unit (not shown) is disposed inside the main body 30.

The sliders 40 support the hands 50. Each of the sliders 40 is engaged with one of the outer side guide rails 32 and one of the inner side guide rails 33 on the main body 30 so as to reciprocate (slide) in the front-back direction. Hereafter, the slider 40 engaged with the inner side guide rails 33 will be referred to as "inner side slider 41", and the sliders 40 engaged with the outer side guide rails 32 will be referred to as "outer side sliders 42 and 42".

The inner side slider 41 has a generally flat plate shape, with the plate surface oriented in the top-bottom direction. The inner side slider 41 is disposed just above the main body 30. On the other hand, the outer side sliders 42 and 42 each have a generally flat plate shape, with the plate surfaces oriented in the top-bottom direction. The outer side sliders 42 and 42 are disposed respectively on the right side and the left side of the main body 30.

Each of the inner side slider 41 and the outer side sliders 42 and 42 is connected to the main body driving unit via a drive transmitting mechanism (not-shown) such as a belt. Each of the inner side slider 41 and outer side sliders 42 and 42 is configured to reciprocate in the front-back direction by the driving force of the main body driving unit transmitted through the drive transmitting mechanism.

The hands 50 serve to hold a workpiece or to carry a workpiece thereon. Each of the hands 50 mainly includes a hand fixing portion 53 of a generally rectangular plate shape having the longitudinal direction aligned with the right-left direction, and holding claw portions 54 each extending from the hand fixing portion 53 to the front side. Two of such hands 50 are provided, one of which is fixed to the inner side slider 41 and the other is fixed to the outer side sliders 42 and 42. Hereafter, the hand 50 fixed to the inner side slider 41 will be referred to as "first hand 51", and the hand 50 fixed to the outer side sliders 42 and 42 will be referred to as "second hand 52".

The first hand 51 and the second hand 52 are each configured to reciprocate (slide) in the front-back direction with the inner side slider 41 and the outer side sliders 42 and 42, respectively. The first hand 51 and the second hand 52 are located at different vertical heights from each other so as not to interfere with each other even when the first hand 51 and the second hand 52 are moved independently.

The workpiece transfer mechanism 20 is merely an example, and in no way limits the workpiece transfer mechanism according to the present invention. For example, the "workpiece transfer mechanism" may include a link arm mechanism, instead of the mechanism in which the first hand 51 and the second hand 52 are configured to slide (slide mechanism).

The base member 10 shown in FIGS. 1 and 2 serves to rotate the workpiece transfer mechanism 20 from outside of the vacuum chamber. The base member 10 is of a generally cylindrical shape, having the axial direction aligned with the top-bottom direction. On the upper surface of the base member 10, an upper surface opening portion 11 is formed so as to penetrate in the top-bottom direction (see FIG. 3). Inside the base member 10, the not-shown driving unit, a tank 71 to store water serving as a coolant, a pump 72 to supply the water stored in the tank 71, and so forth are disposed (see FIG. 3). In this embodiment, water is used as the coolant. However, the coolant is not limited to water but may be alcohol or the like, provided that the material is in a liquid phase.

The base member 10 is merely an example, and in no way limits the base member according to the present invention.

The vacuum seal unit 100 shown in FIGS. 1 and 2 is configured to seal a gap between the workpiece transfer mechanism 20 and the base member 10. The vacuum seal unit 100 is disposed between the workpiece transfer mechanism 20 and the base member 10.

The detailed configuration of the vacuum seal unit 100 will be described later.

Thus, the first hand 51 and the second hand 52 of the workpiece transfer mechanism 20 are configured to reciprocate in the front-back direction with the inner side slider 41 and the outer side sliders 42 and 42, respectively. Further, the workpiece transfer mechanism 20 is configured to rotate with respect to the base member 10 with the vacuum seal unit 100 therebetween. In other words, the workpiece transfer apparatus 1 is configured to transfer a workpiece held by the first hand 51 and the second hand 52 to a desired location in the front-back direction and in the right-left direction (horizontal direction).

The workpiece transfer apparatus 1 (more particularly, the workpiece transfer mechanism 20 and the vacuum seal unit 100) is required to be cooled in order to suppress the influence of radiation heat from a workpiece in a high temperature state. Here, it may be assumed that portions required to be cooled in the workpiece transfer mechanism 20 are portions disposed in the vicinity of the workpiece in a high temperature state held by the first hand 51 and the second hand 52. More specifically, the front surface (surface to be cooled P1) of the workpiece transfer mechanism 20, the upper surface (surface to be cooled P2) of the front portion, and the upper surface (surface to be cooled P3) of the outer side sliders 42 and 42 are to be cooled, as shown in FIG. 2. Further, in the vacuum seal unit 100, a rotating shaft 110 to be described later and so forth may be assumed to be the portions required to be cooled.

Next, the configuration of the vacuum seal unit 100 will be described in detail.

The vacuum seal unit 100 shown in FIGS. 1 to 5 includes mainly a support bearing portion 120, the rotating shaft 110, seal rings 130, a cooling flow passage 140, a supply flow passage 162, a return flow passage 161, and a relief flow passage 163.

Figure 3:
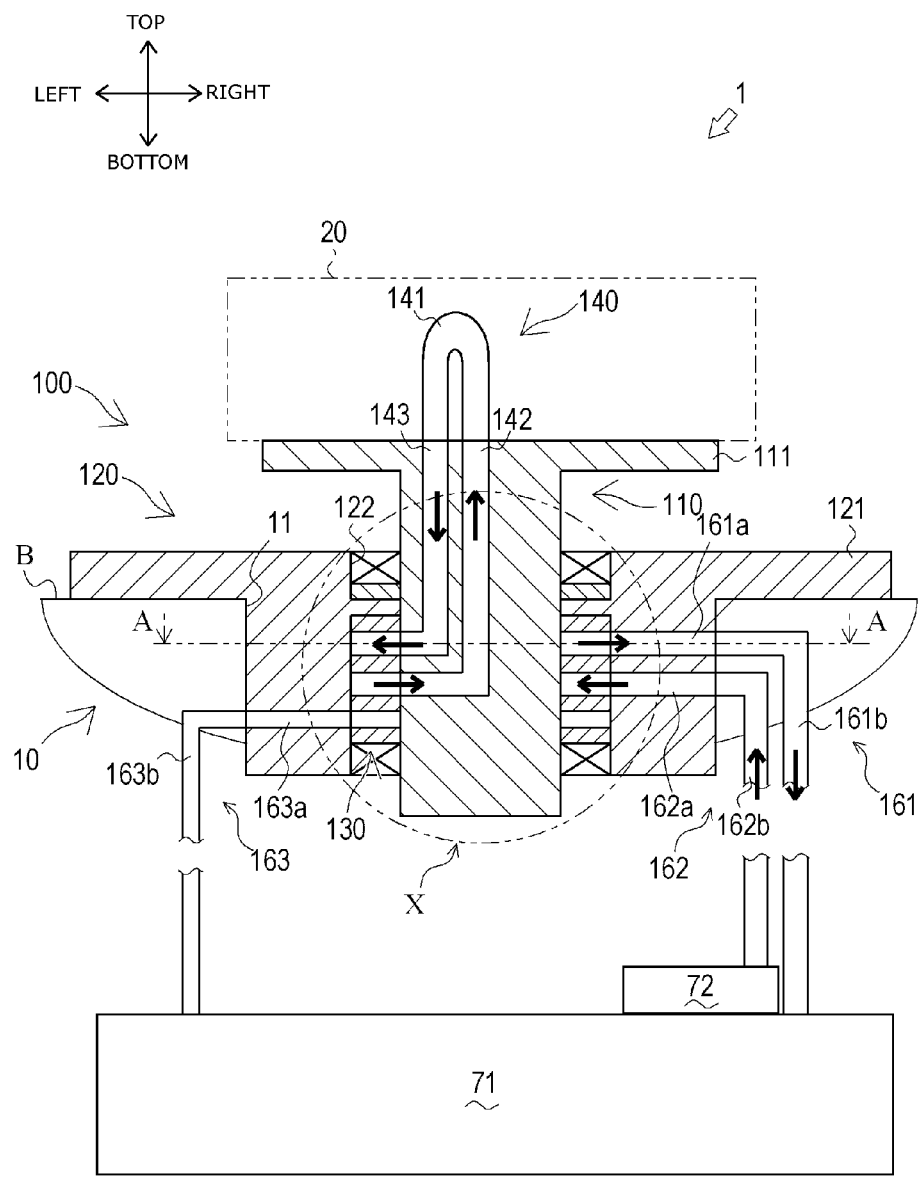
FIG. 3 is a side cross-sectional view showing the configuration of a vacuum seal unit according to the first embodiment.
Figure 4:
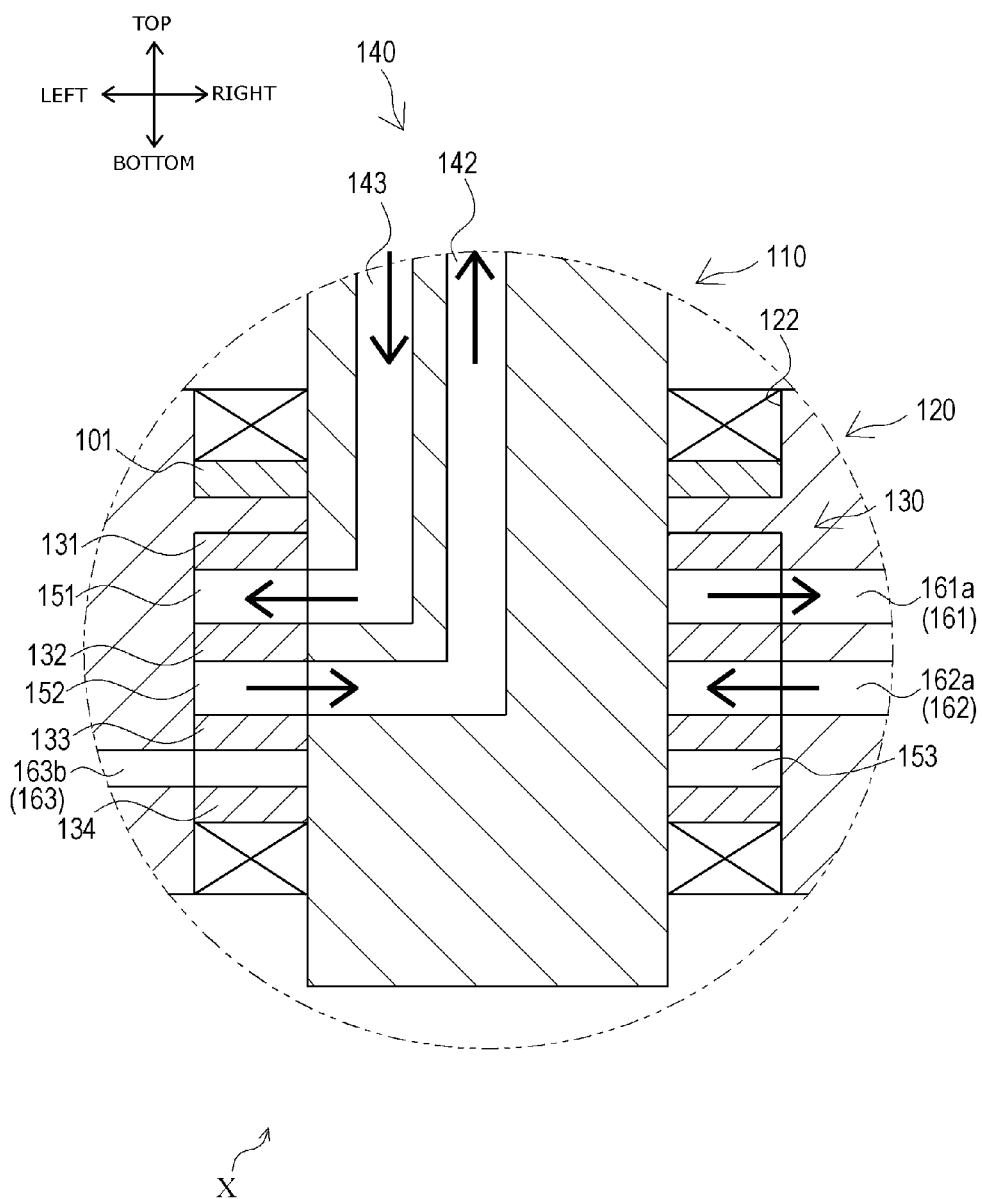
FIG. 4 is an enlarged view of the portion indicated by X in FIG. 3.
Figure 5:
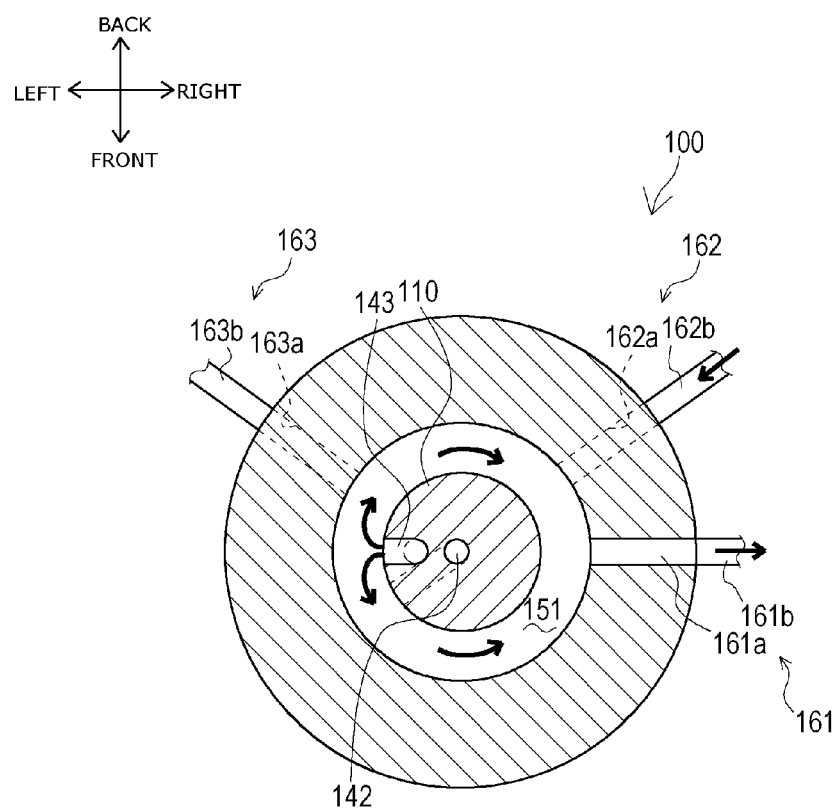
FIG. 5 is a cross-sectional view taken along a line A-A in FIG. 3.

The support bearing portion 120 shown in FIGS. 3 to 5 serves to support the rotating shaft 110 so as to rotate about the axial center. The support bearing portion 120 is of a generally cylindrical shape, having the axial center aligned with the top-bottom direction. In the support bearing portion 120, a central through hole 122 is formed so as to penetrate in the top-bottom direction at a generally central portion in a side view. On the upper end portion of the support bearing portion 120, a generally disc-shaped flange 121 is formed so as to outwardly extend. The outer diameter of the support bearing portion 120 is slightly smaller than the inner diameter of the upper surface opening portion 11 of the base member 10. The support bearing portion 120 is fixed to the upper end portion of the base member 10. More specifically, the support bearing portion 120 is inserted in the upper surface opening portion 11 of the base member 10 from above and fixed thereto such that the flange 121 of the support bearing portion 120 is in contact with the upper surface of the base member 10.

In this embodiment, a space upper than the upper surface of the base member 10 to which the support bearing portion 120 is fixed (hereinafter referred to as "reference surface B") corresponds to the inside of a vacuum chamber in which a vacuum state is maintained, while a space lower than the reference surface B is kept at atmospheric pressure.

The rotating shaft 110 shown in FIGS. 3 to 5 is configured to connect the workpiece transfer mechanism 20 to the base member 10. The rotating shaft 110 is of a generally cylindrical shape, having the axial center aligned with the top-bottom direction. On the upper end portion of the rotating shaft 110, a projection 111 is formed so as to outwardly extend. On the projection 111, the workpiece transfer mechanism 20 is placed and fixed thereto with a predetermined fixing member (not shown). Thus, the workpiece transfer mechanism 20 is fixed to the upper end portion of the rotating shaft 110. The lower end portion of the rotating shaft 110 downwardly extends from the support bearing portion 120 and is connected to the driving unit inside the base member 10. With such a configuration, the workpiece transfer mechanism 20 and the base member 10 are connected to each other via the rotating shaft 110. Accordingly, when the rotating shaft 110 is rotated about the axial center by a driving force from the driving unit, the workpiece transfer mechanism 20 fixed to the upper end portion of the rotating shaft 110 is made to rotate about the axial center of the rotating shaft 110. Between the rotating shaft 110 and the support bearing portion 120, a vacuum seal 101 and a seal ring 130 are disposed in order to keep airtightness.

The seal rings 130 shown in FIGS. 3 and 4 are annular-shaped sealing members. The seal rings 130 are fitted around the rotating shaft 110, and, in a plan view, disposed between the rotating shaft 110 and the support bearing portion 120. To be more detailed, the outer circumferential surface of each seal ring 130 is disposed in contact with the inner circumferential surface of the central through hole 122 of the support bearing portion 120. Meanwhile, the inner circumferential surface of the seal ring 130 is disposed in contact with the outer circumferential surface of the rotating shaft 110. Thus, the rotating shaft 110 and the support bearing portion 120 are liquid-tightly and slidably in contact with each other with the seal rings 130 therebetween. A plurality of (four pieces in this embodiment) seal rings 130 are provided. The four seal rings 130 are disposed in the top-bottom direction at predetermined intervals. Hereafter, for convenience sake in description, the four seal rings 130 will be referred to as "first seal ring 131", "second seal ring 132", "third seal ring 133", and "fourth seal ring 134", from the top.

Hereafter, the configuration of the first seal ring 131 and the second seal ring 132 will be described in detail with reference to FIGS. 3 to 5.

The first seal ring 131 and the second seal ring 132 are disposed adjacent to each other at a predetermined interval in the top-bottom direction. Then, between the first seal ring 131 and the second seal ring 132, a space (hereafter, referred to as "first space 151") is defined by four members (surfaces), namely the lower surface of the first seal ring 131, the upper surface of the second seal ring 132, the inner circumferential surface of the central through hole 122 of the support bearing portion 120 (between the first seal ring 131 and the second seal ring 132), and the outer circumferential surface of the rotating shaft 110 (between the first seal ring 131 and the second seal ring 132).

The first space 151 is formed in a circular ring shape so as to surround the periphery of the rotating shaft 110 (so as to outwardly extend from the outer circumferential surface of the rotating shaft 110). The first space 151 serves to temporarily store the coolant that has cooled the workpiece transfer mechanism 20. Further, to the first space 151, the return flow passage 161 and the cooling flow passage 140 are connected.

The return passage 161 is a flow passage through which a coolant flows upon being discharged from the first space 151 (when being returned to the tank 71). The return passage 161 includes a first through-hole 161a and a return pipe 161b.

The first through-hole 161a is formed so as to penetrate through the side wall of the support bearing portion 120 from the inside to outside thereof. To be more detailed, in a plan view, the first through-hole 161a is formed so as to penetrate in the radial direction between the inner circumferential surface that defines the first space 151 and the outer circumferential surface of the support bearing portion 120.

The return pipe 161b is formed of a hollow pipe member. An end portion of the return pipe 161b is connected to the first through-hole 161a on the outer circumferential surface of the support bearing portion 120. The other end portion of the return pipe 161b extends downward and is disposed inside the tank 71.

Hereafter, the configuration of the second seal ring 132 and the third seal ring 133 will be described in detail with reference to FIGS. 3 to 5.

The second seal ring 132 and the third seal ring 133 are disposed adjacent to each other at a predetermined interval in the top-bottom direction. Then, between the second seal ring 132 and the third seal ring 133, a space (hereafter, referred to as "second space 152") is defined by four members (surfaces), namely the lower surface of the second seal ring 132, the upper surface of the third seal ring 133, the inner circumferential surface of the central through hole 122 of the support bearing portion 120 (between the second seal ring 132 and the third seal ring 133), and the outer circumferential surface of the rotating shaft 110 (between the second seal ring 132 and the third seal ring 133).

The second space 152 does not communicate with the first space 151, but is a space independent from the first space 151. The second space 152 is formed in a circular ring shape so as to surround the periphery of the rotating shaft 110 (so as to outwardly extend from the outer circumferential surface of the rotating shaft 110). The second space 152 serves to temporarily store the coolant about to cool the workpiece transfer mechanism 20. Further, to the second space 152, a supply flow passage 162 and the cooling flow passage 140 are connected.

The supply flow passage 162 is a flow passage through which the coolant stored in the tank 71 flows when being supplied to the second space 152 by the pump 72. The supply flow passage 162 includes a second through-hole 162a and a supply pipe 162b.

The second through-hole 162a is formed so as to penetrate through the side wall of the support bearing portion 120 from the inside to outside thereof. To be more detailed, in a plan view, the second through-hole 162a is formed so as to penetrate in the radial direction between the inner circumferential surface that defines the second space 152 and the outer circumferential surface of the support bearing portion 120.

The supply pipe 162b is formed of a hollow pipe member. An end portion of the supply pipe 162b is connected to the second through-hole 162a on the outer circumferential surface of the support bearing portion 120. The other end portion of the supply pipe 162b extends downward and is connected to the pump 72.

Hereafter, the configuration of the third seal ring 133 and the fourth seal ring 134 will be described in detail with reference to FIGS. 3 to 5.

The third seal ring 133 and the fourth seal ring 134 are disposed adjacent to each other at a predetermined interval in the top-bottom direction. Then, between the third seal ring 133 and the fourth seal ring 134, a space (hereafter, referred to as "third space 153") is defined by four members (surfaces), namely the lower surface of the third seal ring 133, the upper surface of the fourth seal ring 134, the inner circumferential surface of the central through hole 122 of the support bearing portion 120 (between the third seal ring 133 and the fourth seal ring 134), and the outer circumferential surface of the rotating shaft 110 (between the third seal ring 133 and the fourth seal ring 134).

The third space 153 does not communicate with neither of the first space 151 nor the second space 152, but is a space independent from both of the first space 151 and the second space 152. The third space 153 is formed in a circular ring shape so as to surround the periphery of the rotating shaft 110 (so as to outwardly extend from the outer circumferential surface of the rotating shaft 110). The third space 153 serves to temporarily store the coolant that has leaked from the third seal ring 133 that defines the second space 152. Further, to the third space 153, the relief flow passage 163 is connected.

The relief flow passage 163 is a flow passage through which the coolant introduced into the third space 153 flows upon being discharged from the third space 153 (when being returned to the tank 71). The relief flow passage 163 includes a third through-hole 163a and a relief pipe 163b.

The third through-hole 163a is formed so as to penetrate through the side wall of the support bearing portion 120 from the inside to outside thereof. To be more detailed, in a plan view, the third through-hole 163a is formed so as to penetrate in the radial direction between the inner circumferential surface that defines the third space 153 and the outer circumferential surface of the support bearing portion 120.

The relief pipe 163b is formed of a hollow pipe member. An end portion of the relief pipe 163b is connected to the third through-hole 163a on the outer circumferential surface of the support bearing portion 120. The other end portion of the relief pipe 163b extends downward and is disposed inside the tank 71.

Next, the configuration of the cooling flow passage 140 will be described in detail with reference to FIGS. 3 to 5.

The cooling passage 140 is a flow passage that allows the coolant in the second space 152 to flow into the first space 151 so as to cool the workpiece transfer mechanism 20 and the rotating shaft 110. The cooling flow passage 140 is formed so as to circulate through the inside of the rotating shaft 110 and the workpiece transfer mechanism 20. Hereafter, for convenience sake in description, the cooling passage 140 will be sectioned into "supply line 142", "return line 143", and "cooling line 141".

The supply line 142 is a flow passage that allows the coolant in the second space 152 to flow toward the cooling line 141 (upward). The supply line 142 is formed of a through hole that penetrates through inside of the rotating shaft 110. An end portion of the supply line 142 communicates with the outer circumferential surface of the rotating shaft 110 that defines the second space 152. The other end portion of the supply line 142 communicates with the upper surface of the rotating shaft 110. In a side view, the supply line 142 has a generally L shape.

The return line 143 is a flow passage that allows the coolant that has cooled the workpiece transfer mechanism 20 to flow from the cooling line 141 toward the first space 151 (downward). The return line 143 is formed of a through hole that penetrates through inside of the rotating shaft 110. An end portion of the return line 143 communicates with the upper surface of the rotating shaft 110. The other end portion of the return line 143 communicates with the outer circumferential surface of the rotating shaft 110 that defines the first space 151. In a side view, the return line 143 has a generally L shape.

The cooling line 141 is a flow passage configured to cool the workpiece transfer mechanism 20. The cooling line 141 is formed of a hollow pipe member. The cooling line 141 is disposed above the rotating shaft 110. An end portion of the cooling line 141 is connected to the other end portion of the supply line 142 on the upper surface of the rotating shaft 110. The other end portion of the cooling line 141 is connected to the first mentioned end portion of the return line 143 on the upper surface of the rotating shaft 110. In a side view, the cooling line 141 has a generally U shape turned upside down. The cooling line 141 constitutes a part of the workpiece transfer mechanism 20, and is located close to portions specifically required to be cooled (for example, the surfaces to be cooled P1, P2, and P3).

Thus, the cooling flow passage 140 is composed of the cooling line 141, and the supply line 142 and the return line 143 respectively connected to the cooling line 141 and formed generally in a U shape turned upside down as a whole. Further, the cooling flow passage 140 constitutes a single-line flow passage as a whole, having an end portion communicating with the outer circumferential surface of the rotating shaft 110 that defines the first space 151 and the other end portion communicating with the outer circumferential surface of the rotating shaft 110 that defines the second space 152.

Next, the flow of the coolant will be described in detail with reference to FIGS. 3 to 5.

The arrowed lines shown in FIGS. 3 to 5 indicate the flow direction of the coolant.

The coolant is stored in the tank 71. Then, the coolant flows from the tank 71 through the supply flow passage 162 and is supplied to the second space 152 (temporarily stored) by the pump 72. After that, the coolant in the second space 152 flows through the cooling flow passage (more specifically, the supply line 142, the cooling line 141, and the return line 143) and is introduced into the first space 151 (temporarily stored). After that, the coolant in the first space 151 flows through the return flow passage 161 and is returned to the tank 71. Thus, the flow of the coolant is arranged so as to circulate inside the workpiece transfer apparatus 1.

With such a configuration, the workpiece transfer apparatus 1 can be cooled. More specifically, the flow of the coolant through the cooling line 141 of the cooling flow passages 140 can cool the workpiece transfer mechanism 20. Further, the flow of the coolant through the supply line 142 and the return line 143 of the cooling flow passages 140 can cool the rotating shaft 110 heated up by heat conduction from the workpiece and the workpiece transfer mechanism 20 in a high temperature state.

Next, description will be given in detail with regard to the flow of the coolant, especially, the flow of the coolant in the cooling flow passage 140 when the workpiece transfer mechanism 20 is made to rotate.

Here, the state in which the workpiece transfer mechanism 20 is made to rotate corresponds, as described above, a state in which the rotating shaft 110 is rotating about the axial center. When the rotating shaft 110 is rotating about the axial center, the cooling flow passage 140 formed in the rotating shaft 110 is made to rotate together with the rotating shaft 110.

As described above, the second space 152 that temporarily stores the coolant that flows into the cooling flow passage 140 is formed so as to surround the periphery of the rotating shaft 110. Accordingly, when the rotating shaft 110 rotates about the axial center, it is only the outer circumferential surface of the rotating shaft 110 that rotates, among the four members (surfaces) that define the second spac3e 152, namely the lower surface of the second seal ring 132, the upper surface of the third seal ring 133, the inner circumferential surface of the central through hole 122 of the support bearing portion 120 (between the second seal ring 132 and the third seal ring 133), and the outer circumferential surface of the rotating shaft 110 (between the second seal ring 132 and the third seal ring 133). In other words, when the rotating shaft 110 rotates about the axial center, the outer circumferential surface of the rotating shaft 110 also rotates about the axial center of the rotating shaft 110. At this time, the outer circumferential surface of the rotating shaft 110 that defines the second space 152 continues to define the second space 152 regardless of rotating.

Thus, even when the rotating shaft 110 is rotating, the communication is constantly maintained between the first mentioned end portion of the supply line 142 (communicating with the outer circumferential surface of the rotating shaft 110 that defines the second space 152) and the outer circumferential surface of the rotating shaft 110 that defines the second space 152. Therefore, even when the rotating shaft 110 is rotating, the coolant in the second space 152 can always flow into the cooling flow passage 140.

Further, as described above, the first space 151 that temporarily stores the coolant that flows from the cooling flow passage 140 and returns to the tank 71 is formed so as to surround the periphery of the rotating shaft 110. Accordingly, when the rotating shaft 110 rotates about the axial center, it is only the outer circumferential surface of the rotating shaft 110 that rotates, among the four members (surfaces), namely the lower surface of the first seal ring 131, the upper surface of the second seal ring 132, the inner circumferential surface of the central through hole 122 of the support bearing portion 120 (between the first seal ring 131 and the second seal ring 132), and the outer circumferential surface of the rotating shaft 110 (between the first seal ring 131 and the second seal ring 132). In other words, when the rotating shaft 110 rotates about the axial center, the outer circumferential surface of the rotating shaft 110 also rotates about the axial center of the rotating shaft 110. At this time, the outer circumferential surface of the rotating shaft 110 that defines the first space 151 continues to define the first space 151 regardless of rotating.

Thus, even when the rotating shaft 110 is rotating, the communication is constantly maintained between the other end portion of the return line 143 (communicating with the outer circumferential surface of the rotating shaft 110 that defines the first space 151) and the outer circumferential surface of the rotating shaft 110 that defines the first space 151. Therefore, even when the rotating shaft 110 is rotating, the coolant that has flowed through the cooling flow passage 140 is always introduced into the first space 151.

With such a configuration, even when the workpiece transfer mechanism 20 is made to rotate (the rotating shaft 110 is rotating), the workpiece transfer apparatus 1 can introduce the coolant into the cooling flow passage 140. That is, even when the workpiece transfer mechanism 20 is made to rotate (the rotating shaft 110 is rotating), the workpiece transfer apparatus 1 can make the coolant circulate thereinside and can make the workpiece transfer mechanism 20 rotate (eliminate the limitation on the angle of rotation of the workpiece transfer mechanism 20).

Further, in the vacuum seal unit 100, pipe members disposed on the atmosphere side namely the return pipe 161b, the supply pipe 162b, and the relief pipe 163b are located outside the support bearing portion 120. Accordingly, the maintenance for the pipes can be performed easily.

Furthermore, in the vacuum seal unit 100, the cooling flow passage 140 is formed inside the vacuum seal unit 100 (more specifically, inside the rotating shaft 110). Therefore, the vacuum seal unit 100 can be cooled efficiently from the internal portion thereof.

Figure 6:
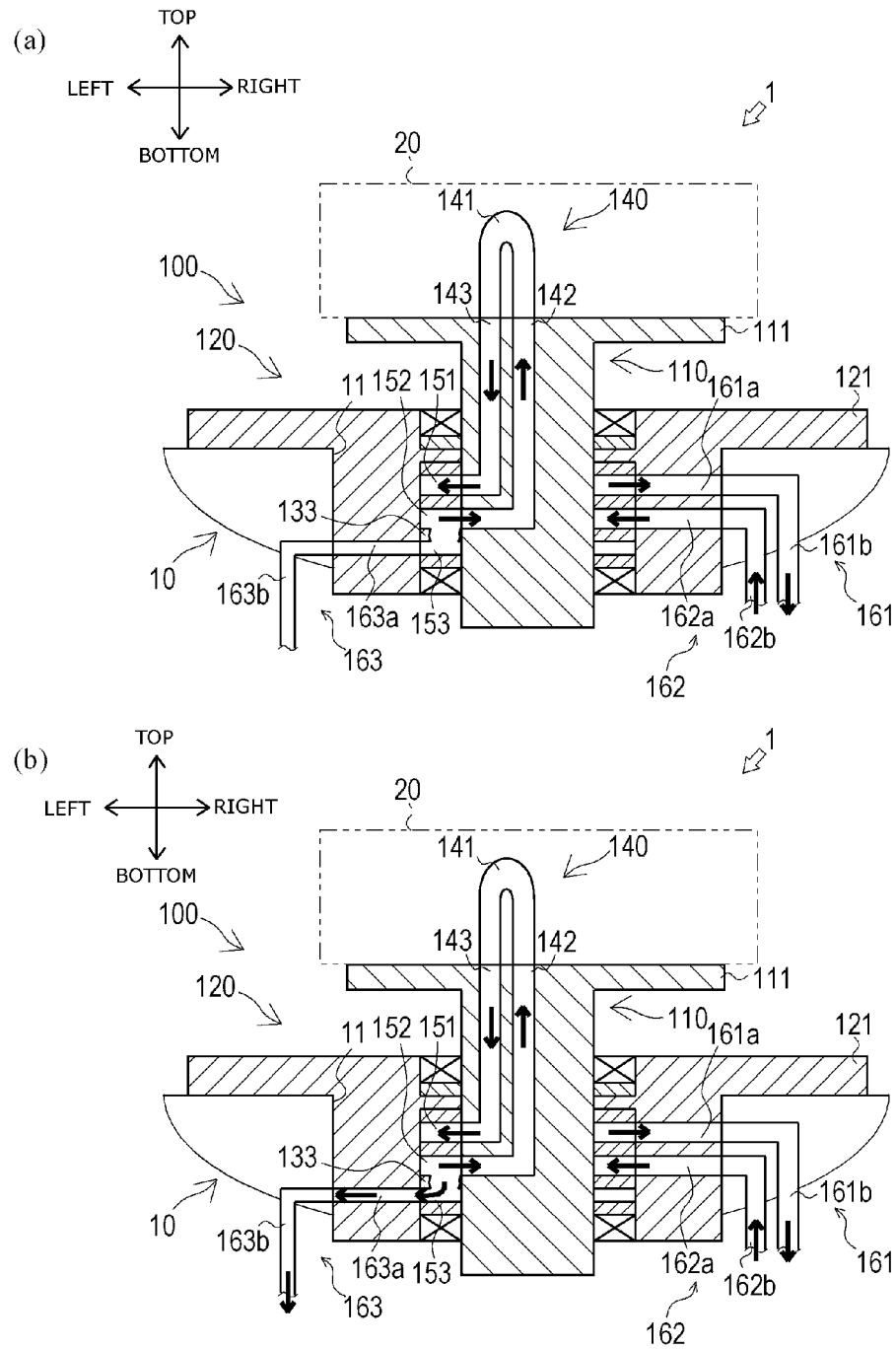
FIG. 6A is a side cross-sectional view showing a state in which a third seal ring is broken in the workpiece transfer apparatus according to the first embodiment.
FIG. 6B is a side cross-sectional view showing how a coolant is discharged from a relief pipe in the state shown in FIG. 6A.

Referring now to FIG. 6, the flow of the coolant formed in the case where the coolant leaks from the third seal ring 133 will be described in detail.

In FIG. 6, it is assumed that the coolant has leaked from the third seal ring 133.

As shown in FIG. 6A, in the case the third seal ring 133 is broken or worn, the second space 152 and the third space 153 that have been independent from each other communicate with each other through the location of the breakage or wear of the third seal ring 133. In this case, as shown in FIG. 6B, the coolant that has leaked from the second space 152 through the location of the breakage or wear of the third seal ring 133 is introduced into the third space 153. The coolant introduced into the third space 153 is temporarily stored therein. Thereafter, the coolant stored in the third space 153 flows through the relief flow passage 163 and is discharged outside the vacuum seal unit 100.

With such a configuration, even in the case where the third seal ring 133 is broken or worn, the coolant in the second space 152 can be prevented from leaking to the atmosphere side (inside the base member 10) and thus sticking to other components so as to incur rust. In other words, the influences of the coolant leakage on the workpiece transfer apparatus 1 can be suppressed.

Although the above description refers to the case where the third seal ring 133 is broken or worn as an example, the coolant in the second space 152 may also leak in the case where a pressure exceeding a permissible level is loaded on the supply flow passage 162. In such a case, equally, the coolant in the second space 152 can be prevented from leaking to the atmosphere side (inside the base member 10) and thus sticking to other components so as to incur rust.

Further, although the above description refers to the case where the third seal ring 133 is broken or worn, for example the second seal ring 132 may also be broken or worn, so that the first space 151 and the second space 152 that have been independent from each other communicate with each other. In this case, the coolant that has leaked from the first space 151 through the location of the breakage or wear of the second seal ring 132 is introduced to the second space 152. Accordingly, even in the case where the second seal ring 132 is broken or worn, the coolant in the first space 151 can be prevented from leaking to the atmosphere side (inside the base member 10) and thus sticking to other components.

Still further, although the third space 153 is disposed below the second space 152 in the foregoing configuration, the third space 153 may be disposed above the first space 151, or below the second space 152 and above the first space 151. In the case where the third space 153 is disposed above the first space 151, the coolant that has leaked from the first space 151 to the vacuum chamber side can be discharged to outside of the third space 153 (vacuum seal unit 100).

The vacuum seal unit 100 configured as above is merely an example, and in no way limits the vacuum seal unit according to the present invention.

More specifically, the rotating shaft 110 is merely an example, and in no way limits the rotating shaft according to the present invention. The support bearing portion 120 is merely an example, and in no way limits the support bearing portion according to the present invention. The first, second, third and fourth seal rings 131, 132, 133, and 134 are merely exemplary, and in no way limit the plurality of annular seal members according to the present invention. The cooling flow passage 140 is merely exemplary, and in no way limits the cooling flow passage according to the present invention. The first, second and third spaces 151, 152, and 153 are only exemplary, and in no way limit the first, second and third spaces according to the present invention. In addition, the relief flow passage 163 is merely an example of the second cooling flow passage according to the present invention, which is in no way limited thereto.

For example, it is not mandatory that the cooling line 141 of the cooling flow passage 140 be formed in the generally U-shape turned upside down in a side view. In other words, as long as the cooling flow passages 140 can be located in a region required to be cooled in the workpiece transfer mechanism 20, a different shape such as a generally rectangular shape in a side view may be adopted.

It is not mandatory that the supply line 142 and the return line 143 of the cooling flow passage 140 be formed in the generally L-shape (combination of two straight through holes) in a side view. For example, the supply line 142 and the return line 143 may each be formed of a meander through hole in a side view, instead of the combination of the two straight through holes. Forming the supply line 142 in a meander shape leads to an increase in contact area between the inside of the rotating shaft 110 and the supply line 142, compared with the case where the supply line 142 is formed in a generally L-shape in a side view. Consequently, the cooling effect for the rotating shaft 110 by the coolant flowing through the supply line 142 can be further enhanced.

Further, it is not mandatory that the supply line 142 and the return line 143 be formed of a through-hole penetrating through inside the rotating shaft 110. Instead, the supply line 142 and the return line 143 may each be formed of a hollow pipe member, similarly to the cooling line 141. Further, the supply line 142 and the return line 143 may be integrally formed of a hollow pipe member connected to the cooling line 141 (as a unified member).

It is not mandatory that the first through-hole 161a, the second through-hole 162a, and the third through-hole 163a be formed of a through hole penetrating inside the support bearing portion 120. For example, the first through-hole 161a, the second through-hole 162a, and the third through-hole 163a may each be formed of a hollow pipe member, similarly to the supply pipe 162b, the return pipe 161b, and the relief pipe 163b. Further, the first through-hole 161a, the second through-hole 162a, and the third through-hole 163a may each be formed of a hollow pipe member connected to the supply pipe 162b, the return pipe 161b, and the relief pipe 163b, respectively (as a unified member).

Next, the configuration of a vacuum seal unit 200 according to a second embodiment of the present invention will be described with reference to FIG. 7.

Figure 7:
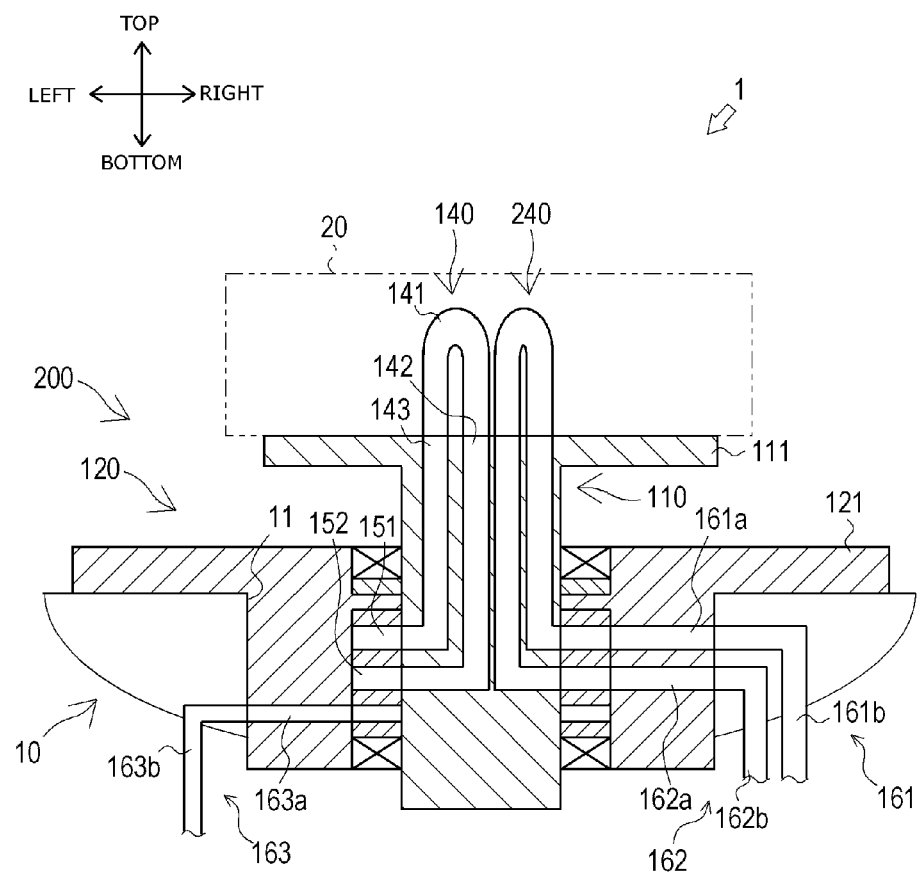
FIG. 7 is a side cross-sectional view showing the configuration of a vacuum seal unit according to a second embodiment of the present invention.

In FIG. 7, the same constituents as those of the vacuum seal unit 100 will be given the same reference numeral, and the description thereof will not be repeated.

The vacuum seal unit 200 according to the second embodiment includes, in addition to the cooling flow passage 140, a cooling flow passage 240 having generally the same configuration as that of the cooling flow passage 140. More specifically, similarly to the cooling flow passage 140, the cooling flow passage 240 constitutes a single flow passage as a whole having an end portion communicating with the outer circumferential surface of the rotating shaft 110 that defines the first space 151 and the other end portion communicating with the outer circumferential surface of the rotating shaft 110 that defines the second space 152.

With such a configuration, the workpiece transfer apparatus 1 can be cooled through a plurality of passages. For example, the cooling line 141 of the cooling flow passage 140 may be disposed at the front side of the workpiece transfer mechanism 20, and the cooling line 141 of the cooling flow passage 240 may be disposed at the rear side of the workpiece transfer mechanism 20. Accordingly, as compared with the case of installing just a single line of the cooling line 141, the degree of freedom in designing can be increased and the workpiece transfer mechanism 20 can be cooled more efficiently.

Next, the configuration of a vacuum seal unit 300 according to a third embodiment of the present invention will be described with reference to FIG. 8.

Figure 8:
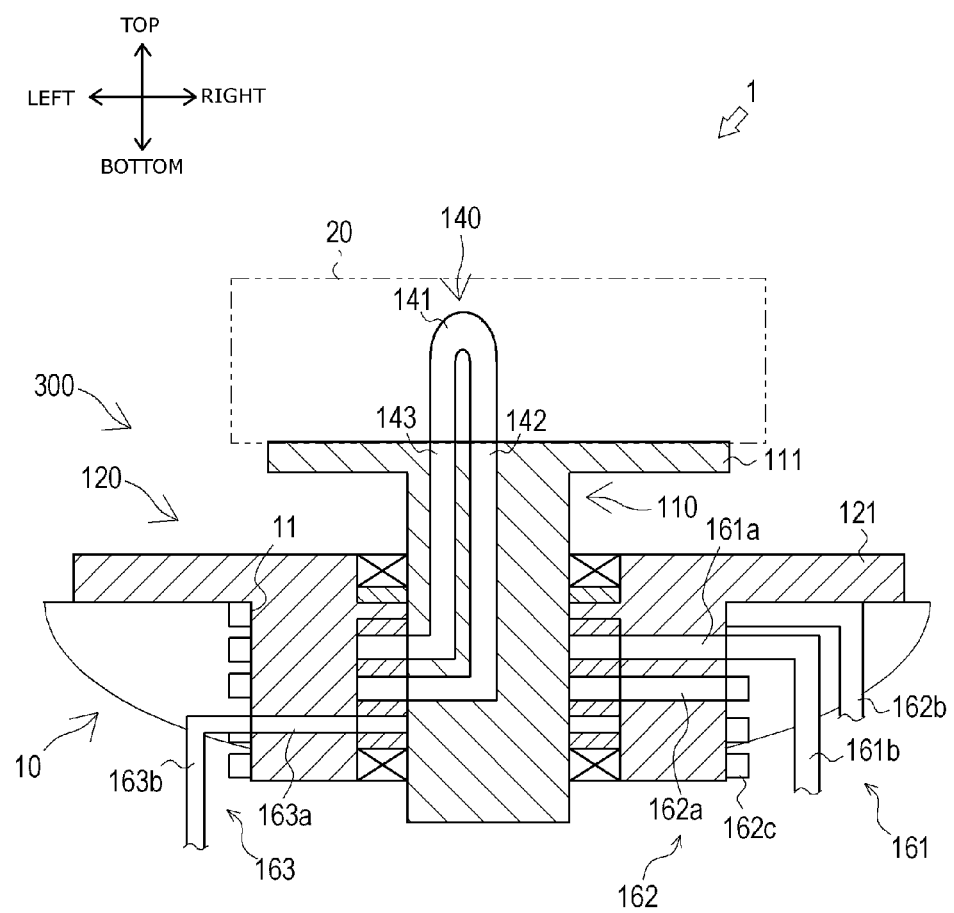
FIG. 8 is a side cross-sectional view showing the configuration of a vacuum seal unit according to a third embodiment of the present invention.

In FIG. 8, the same constituents as those of the vacuum seal unit 100 will be given the same reference numeral, and the description thereof will not be repeated.

In the vacuum seal unit 300 according to the third embodiment, the supply pipe 162b of the supply flow passage 162 is not directly connected to the second through hole 162a. More specifically, a wound pipe 162c is disposed between the supply pipe 162b and the second through-hole 162a. The wound pipe 162c is a hollow pipe member wound spirally around the outer circumferential surface of the rotating shaft 110. An end portion of the wound pipe 162c is connected to an end portion of the supply pipe 162b. The other end portion of the wound pipe 162c is connected to the second through hole 162a on the outer circumferential surface of the support bearing portion 120.

With such a configuration, the coolant supplied into the supply line 142 from the tank 71 by the pump 72 flows through the wound pipe 162c. After flowing through the wound pipe 162c, the coolant flows through the second through-hole 162a. As a result, the vacuum seal unit 100 can be cooled not only from the inside but also from the outside.

Next, the configuration of a vacuum seal unit 400 according to a fourth embodiment of the present invention will be described with reference to FIG. 9.

Figure 9:
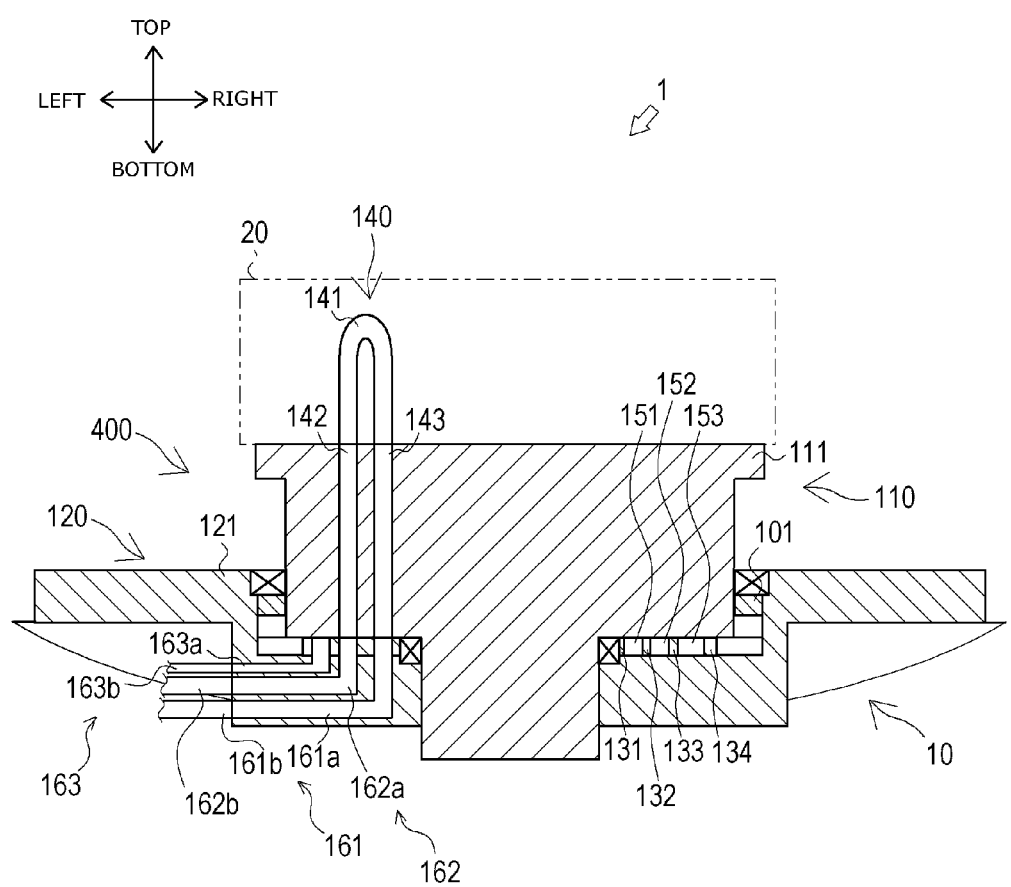
FIG. 9 is a side cross-sectional view showing the configuration of a vacuum seal unit according to a fourth embodiment of the present invention.
Figure 10:
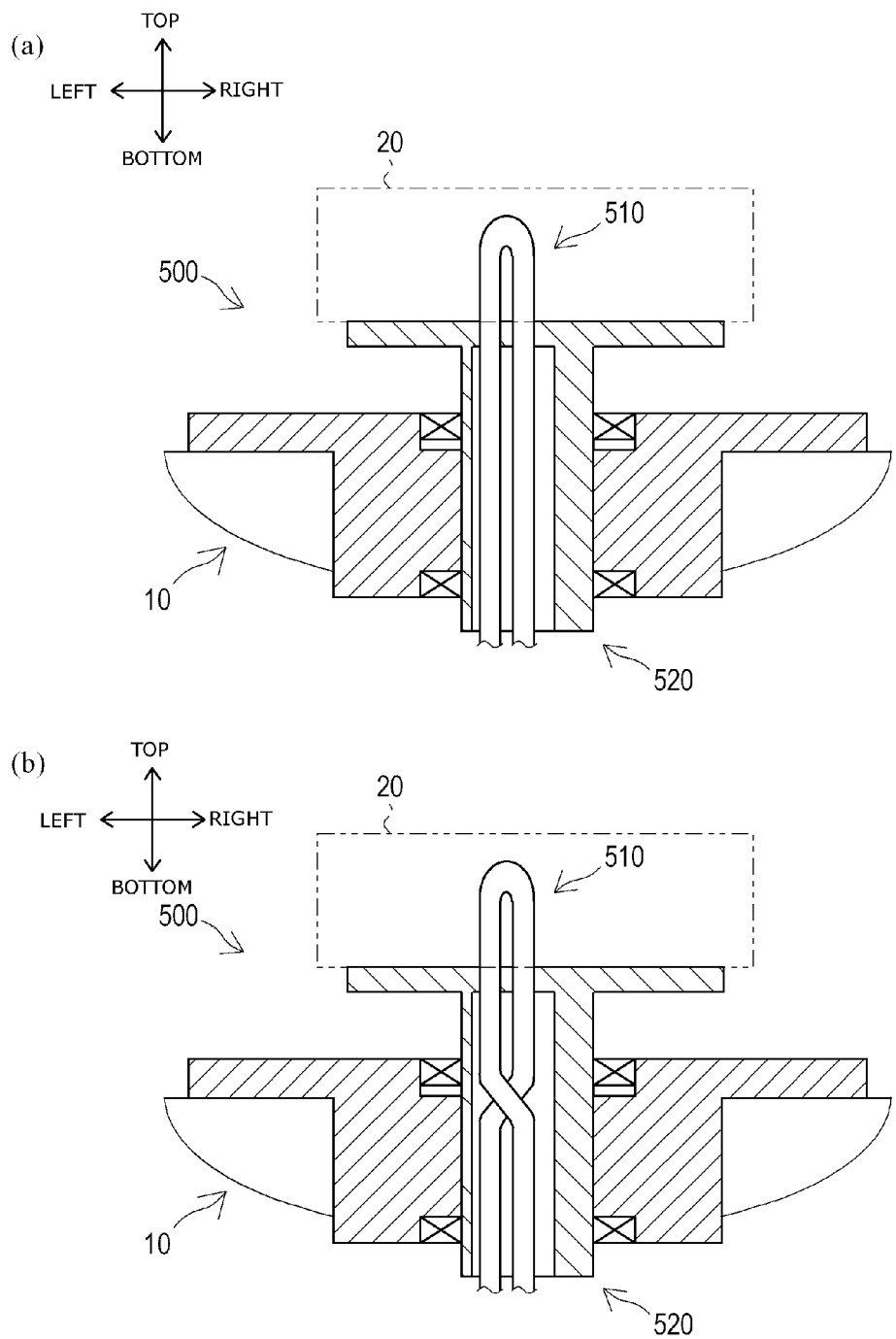
FIG. 10A is a side cross-sectional view showing the configuration of a vacuum seal unit with a conventional cooling pipe.
FIG. 10B is a side cross-sectional view showing a state in which a rotating shaft is rotated in the vacuum seal unit with the conventional cooling pipe.

In FIG. 9, the same constituents as those of the vacuum seal unit 100 will be given the same reference numeral, and the description thereof will not be repeated.

In the vacuum seal unit 400 according to the fourth embodiment, the first, the second, the third, and the fourth seal rings 131, 132, 133, and 134 are disposed on the lower surface of the rotating shaft 110, instead of being fitted around the rotating shaft 110 so as to be disposed between the rotating shaft 110 and the support bearing portion 120 in a plan view. Therefore, the first, the second, and the third spaces 151, 152, and 153 are defined under the lower surface of the rotating shaft 110 instead of being defined so as to outwardly extend from the outer circumferential surface of the rotating shaft 110.

With such a configuration, the vertical height of the rotating shaft 110 can be reduced.

Consequently, the vacuum seal unit 100 can be made smaller in size.

Further, the configurations of the vacuum seal units 200, 300, and 400 may be employed in combination. For example, the configurations of the vacuum seal units 200 and 300 may be incorporated in a single vacuum seal unit, or the configurations of the vacuum seal units 200, 300, and 400 may be incorporated in a single vacuum seal unit.

As described above, the workpiece transfer apparatus 1 according to the embodiment of the present invention includes:

the workpiece transfer mechanism 20 configured to transfer a workpiece inside the vacuum chamber, the base member 10 that rotates the workpiece transfer mechanism 20 from outside of the vacuum chamber, and the vacuum seal unit 100 configured to seal a gap between the workpiece transfer mechanism 20 and the base member 10.

The vacuum seal unit 100 includes:

the rotating shaft 110 connecting the workpiece transfer mechanism 20 and the base member 10, the support bearing portion 120 configured to support the rotating shaft 110 so as to rotate about the axial center, the first, the second, the third, and the fourth seal rings 131, 132, 133, and 134 (a plurality of annular seal members) each disposed between the rotating shaft 110 and the support bearing portion 120, and the cooling flow passage through which the coolant flows, the cooling flow passage being formed so as to circulate through inside the rotating shaft 110 and inside the workpiece transfer mechanism 20.

The seal rings adjacent to each other with a spacing therebetween, out of the first, the second, the third, and the fourth seal rings 131, 132, 133, and 134 (the plurality of annular seal members), and the rotating shaft 110 define the first space 151 and the second space 152 independent from each other and respectively surrounding the outer circumferential surface of the rotating shaft 110.

An end portion of the cooling flow passage 140 communicates with the portion of the outer circumferential surface of the rotating shaft 110 corresponding to the first space 151, and the other end portion of the cooling flow passage 140 communicates with the portion of the outer circumferential surface of the rotating shaft 110 corresponding to the second space 152, so as to allow the coolant introduced into the second space 152 to flow through the cooling flow passage 140 and to reach the first space 151, even when the rotating shaft 110 is rotating about the axial center.

With such a configuration, even when the workpiece transfer mechanism 20 is made to rotate, in other words even when the rotating shaft 110 is rotating about the axial center, the cooling flow passage 140 is kept from being twisted and therefore the angle of rotation of the workpiece transfer mechanism 20 is exempted from being restricted. In addition, a liquid such as water can be used as the coolant to be circulated through the cooling flow passage 140.

Further, in the workpiece transfer apparatus 1, the seal rings adjacent to each other with a spacing there between, out of the first, the second, the third, and the fourth seal rings 131, 132, 133, and 134 (the plurality of annular seal members), and the rotating shaft 110 define the third space 153 independent from both the first space 151 and the second space 152 and surrounding the outer circumferential surface of the rotating shaft 110, and the vacuum seal unit 100 includes the relief flow passage 163 (the second cooling flow passage) communicating between inside and outside of the third space 153.

The third space 153 allows the coolant that has leaked through the third seal ring 133 that defines the second space 152 to be introduced into the third space 153, and to flow through the relief flow passage 163 (the second cooling flow passage) thus to be discharged outside, even when the rotating shaft 110 is rotating about the axial center.

With such a configuration, even when the coolant introduced into the second space 152 leaks, the coolant that has leaked is introduced into the third space 153, flows through the relief flow passage 163, and is discharged to outside. Therefore, the influence of the leakage of the coolant on the workpiece transfer apparatus 1 (for example, occurrence of vacuum leakage or the like) can be suppressed.

DESCRIPTION OF THE REFERENCE NUMERAL 1 workpiece transfer apparatus
10 base member
20 workpiece transfer mechanism
100 vacuum seal unit 110 rotating shaft
120 support bearing portion
130 seal unit
131 first seal unit
132 second seal unit
133 third seal unit
134 fourth seal unit
140 cooling flow passage
151 first space
152 second space
153 third space
163 relief flow passage

What is claimed is:

1. A workpiece transfer apparatus comprising:
a workpiece transfer mechanism configured to transfer a workpiece inside a vacuum chamber;
a base member that rotates the workpiece transfer mechanism from outside of the vacuum chamber; and
a vacuum seal unit configured to seal a gap between the workpiece transfer mechanism and the base member,
wherein the vacuum seal unit includes:
a rotating shaft connecting the workpiece transfer mechanism and the base member,
a support bearing portion configured to support the rotating shaft so as to rotate about the axial center thereof,
a plurality of annular seal members each disposed between the rotating shaft and the support bearing portion, and
a cooling flow passage through which a coolant flows, the cooling flow passage being formed so as to circulate through inside the rotating shaft and inside the workpiece transfer mechanism,
the annular seal members adjacent to each other with a spacing therebetween, out of the plurality of annular seal members, and the rotating shaft define a first space and a second space independent from each other and respectively surrounding the outer circumferential surface of the rotating shaft,
an end portion of the cooling flow passage communicates with a portion of the outer circumferential surface of the rotating shaft corresponding to the first space, and
the other end portion of the cooling flow passage communicates with a portion of the outer circumferential surface of the rotating shaft corresponding to the second space,
so as to allow the coolant introduced into the second space to flow through the cooling flow passage and to reach the first space, even when the rotating shaft is rotating about the axial center.

2. The workpiece transfer apparatus according to claim 1,
wherein the annular seal members adjacent to each other with a spacing therebetween, out of the plurality of annular seal members, and the rotating shaft define a third space independent from both the first space and the second space and surrounding the outer circumferential surface of the rotating shaft,
the vacuum seal unit further includes a second cooling flow passage communicating between inside and outside of the third space,
the third space allows the coolant that has leaked through the annular seal member that defines the first space and the second space to be introduced into the third space, and to flow through the second cooling flow passage thus to be discharged outside, even when the rotating shaft is rotating about the axial center.

* * * * *